(12) United States Patent
Ogami et al.

(10) Patent No.: US 10,618,114 B2
(45) Date of Patent: Apr. 14, 2020

(54) SURFACE-COATED CUTTING TOOL

(71) Applicant: MITSUBISHI MATERIALS CORPORATION, Tokyo (JP)

(72) Inventors: Tsuyoshi Ogami, Naka (JP); Tatsuo Hashimoto, Akashi (JP); Natsuki Ichimiya, Tokyo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 168 days.

(21) Appl. No.: 15/771,287

(22) PCT Filed: Oct. 27, 2016

(86) PCT No.: PCT/JP2016/081858
§ 371 (c)(1),
(2) Date: Apr. 26, 2018

(87) PCT Pub. No.: WO2017/073655
PCT Pub. Date: May 4, 2017

(65) Prior Publication Data
US 2018/0311743 A1 Nov. 1, 2018

(30) Foreign Application Priority Data

Oct. 28, 2015 (JP) ................................. 2015-211483
Oct. 26, 2016 (JP) ................................. 2016-209194

(51) Int. Cl.
*B23B 27/14* (2006.01)
*C23C 28/00* (2006.01)
(Continued)

(52) U.S. Cl.
CPC .......... *B23B 27/14* (2013.01); *C23C 14/0641* (2013.01); *C23C 14/325* (2013.01);
(Continued)

(58) Field of Classification Search
USPC ................... 51/307, 309; 428/697, 698, 699
See application file for complete search history.

(56) References Cited

U.S. PATENT DOCUMENTS

| 8,017,226 B2 | 9/2011 | Yamamoto |
| 2008/0075976 A1 | 3/2008 | Yamamoto et al. |
| | | (Continued) |

FOREIGN PATENT DOCUMENTS

| CN | 101468401 A | 7/2009 |
| CN | 100584993 C | 1/2010 |
| | (Continued) | |

OTHER PUBLICATIONS

Office Action dated Mar. 18, 2019 for the corresponding Chinese Patent Application No. 201680062403.6.
(Continued)

*Primary Examiner* — Archene A Turner
(74) *Attorney, Agent, or Firm* — Leason Ellis LLP

(57) ABSTRACT

A surface-coated cutting tool includes: a tool body made of any one of tungsten carbide-based cemented carbide, TiCN-based cermet, a cubic boron nitride sintered material, and high-speed tool steel; and a hard coating layer provided on a surface of the tool body. The hard coating layer includes at least a complex nitride layer of Al, Cr, Si, and Cu with an average layer thickness of 0.5 to 8.0 μm. The complex nitride layer of $(Al_{1-a-b-c}Cr_aSi_bCu_c)N$ satisfies $0.15 \leq a \leq 0.40$, $0.05 \leq b \leq 0.20$, and $0.005 \leq c \leq 0.05$ (here, each of a, b, and c is in atomic ratio). The complex nitride layer has a hexagonal crystal structure. A half width of a diffraction peak of a (110) plane present in a range of $2\theta = 55°$ to $65°$ by performing X-ray diffraction on the complex nitride layer is $1.0°$ to $3.5°$.

4 Claims, 2 Drawing Sheets

(51) Int. Cl.
*C23C 30/00* (2006.01)
*C23C 14/32* (2006.01)
*C23C 14/06* (2006.01)
*C23C 28/04* (2006.01)

(52) U.S. Cl.
CPC ............ *C23C 28/00* (2013.01); *C23C 28/044* (2013.01); *C23C 30/005* (2013.01); *B23B 2228/10* (2013.01)

(56) References Cited

U.S. PATENT DOCUMENTS

2009/0011257 A1* 1/2009 Vetter ................. C22C 21/00
  428/697
2009/0130465 A1* 5/2009 Vetter ................. C23C 14/06
  428/446
2011/0183131 A1* 7/2011 Maeda ................. B23F 21/00
  428/216

FOREIGN PATENT DOCUMENTS

| | | |
|---|---|---|
| CN | 102465257 A | 5/2012 |
| CN | 102686772 A | 9/2012 |
| CN | 103764323 A | 4/2014 |
| CN | 104789938 A | 7/2015 |
| JP | 2004-034186 A | 2/2004 |
| JP | 2004-106183 A | 4/2004 |
| JP | 3781374 B | 5/2006 |
| JP | 2008-031517 A | 2/2008 |
| JP | 2008-073800 A | 4/2008 |
| JP | 2010-059456 A | 3/2010 |
| JP | 2011-189470 A | 9/2011 |
| JP | 2012-081548 A | 4/2012 |

OTHER PUBLICATIONS

International Search Report dated Jan. 24, 2017 for the corresponding PCT International Patent Application No. PCT/JP2016/081858.
Supplemental European Search Report dated Feb. 18, 2019 in corresponding European Application No. 16859884.5.

* cited by examiner

SURFACE-COATED CUTTING TOOL

CROSS-REFERENCE TO RELATED PATENT APPLICATIONS

This application is a U.S. National Phase Application under 35 U.S.C. § 371 of International Patent Application No. PCT/JP2016/081858 filed on Oct. 27, 2016 and claims the benefit of Japanese Patent Applications No. 2015-211483, filed on Oct. 28, 2015, and No. 2016-209194, filed on Oct. 26, 2016, all of which are incorporated herein by reference in their entireties. The International Application was published in Japanese on May 4, 2017 as International Publication No. WO/2017/073655 under PCT Article 21(2).

FIELD OF THE INVENTION

The present invention relates to a surface-coated cutting tool (hereinafter, referred to as coated tool) in which a hard coating layer exhibits excellent chipping resistance and wear resistance during cutting work of a high hardness material like hardened steel, and excellent cutting performance is exhibited for a long-term usage.

BACKGROUND OF THE INVENTION

In general, as coated tools, throw-away tips which are detachably attached to the tip end portion of an insert holder to be used for turning or planing a work material such as various kinds of steel and cast iron, drills or miniature drills used for drilling or the like of the work material, end mills used for facing, grooving, shoulder milling, and the like of the work material, solid hobs and pinion cutters used for gear cutting of the work material into tooth shapes, and the like are known.

In addition, various suggestions have hitherto been made for the purpose of improving the cutting performance of coated tools.

For example, as described in Japanese Patent No. 3781374, a coated tool is suggested in which the surface of a tool body made of tungsten carbide (hereinafter, referred to as WC)-based cemented carbide, titanium carbonitride (hereinafter, referred to as TiCN)-based cermet, or the like is coated with one or more hard layers having a cubic structure composed of a metal component primarily containing Cr, Al, and Si and at least one element selected from C, N, O, and B such that the fracturing resistance and wear resistance are improved.

In addition, Japanese Unexamined Patent Application, First Publication No. 2004-34186 suggests a coated tool in which the surface of a tool body is coated with at least one layer of coating containing Si and B by containing, as metallic elements, elements selected from one or more of groups 4a, 5a, and 6a in the periodic table and Al and the element Si, and containing, as non-metallic elements, elements selected from one or more of N, C, O, and S and the element B, and the coating containing Si and B has a mixed phase of a crystalline phase and an amorphous phase, the minimum crystal grain size of crystal grains contained in the crystalline phase is set to be 0.5 nm or more and less than 20 nm, such that the toughness of the Si-containing wear-resistant coating is improved by suppressing embrittlement caused by excessive residual compressive stress without sacrificing the high hardness of the Si-containing wear-resistant coating. Furthermore, it is described that substitution of less than 10 at % of the coating components with Cu is effective in improving oxidation resistance.

In addition, Japanese Unexamined Patent Application, First Publication No. 2008-31517 describes a coated tool in which the surface of a tool body is coated with a hard coating layer, and at least one layer of hard coating is expressed by $(M_aL_b)X_c$ (here, M represents at least one metal element selected from Cr, Al, Ti, Hf, V, Zr, Ta, Mo, W and Y, L represents at least one additional element selected from Mn, Cu, Ni, Co, B, Si, and S, X represents at least one non-metallic element selected from C, N and O, a represents the atomic ratio of M to the sum of M and L, b represents the atomic ratio of L to the sum of M and L, c represents the atomic ratio of X to the sum of M and L, and a, b, and c satisfy $0.85 \leq a \leq 0.99$, $0.01 \leq b \leq 0.15$, $a+b=1$, and $1.00 < c \leq 1.20$), whereby crystal grain refinement and crystal stability are achieved by Cu, Si, and the like which are the components of the hard coating, resulting in an increase in high-temperature hardness, an improvement in wear resistance, and furthermore, an improvement in oxidation resistance.

Furthermore, Japanese Unexamined Patent Application, First Publication No. 2008-73800 suggests a coated tool in which a hard coating having a composition $Al_{1-a-b-c}Si_aMg_bM_c(B_xC_yN_z)$ (here, M is at least one element selected from Nb, V, Zr, Cr, Ti, Cu, and Y, and a, b, c, x, y, and z satisfy $0 \leq a \leq 0.35$, $0 \leq b \leq 0.2$, $0.03 \leq a+b \leq 0.5$, and $0 \leq c \leq 0.1$ in atomic ratio, and $0.9 \leq Al+Si+Mg$, $0 \leq x \leq 0.2$, $0 \leq y \leq 0.4$, $0.5 \leq z \leq 1$, and $x+y+z=1$ are satisfied in atomic ratio) is formed on the surface of a tool body, thereby improving the hardness, oxidation resistance, toughness, and wear resistance of the hard coating. In addition, it is described that in a case where Cu is contained as a component of the hard coating, an increase in the hardness of the coating due to crystal grain refinement, and a lubricating action are expected.

Technical Problem

An improvement in performance of a cutting apparatus in recent years has been remarkable, and there has been a strong demand for power saving and energy saving during cutting work and a further reduction of cost. In accordance with this, there is a trend toward a further increase in speed and efficiency during cutting work. There is no particular problem in a case where the coated tool of the related art is used for cutting work of steel, cast iron, or the like under typical cutting conditions. However, in a case where this is used for cutting work during which high-temperature heat is generated and high impact and mechanical loads are exerted on a cutting edge, such as high-speed milling of a high hardness material like hardened steel, the occurrence of chipping and fracturing cannot be suppressed. Furthermore, wear progression is promoted. Therefore, in the current situation, the coated tool of the related art reaches the end of its service life within a relatively short period of time.

Therefore, from the above-described viewpoints, the inventors intensively conducted researches to develop a coated tool in which a hard coating layer exhibits excellent chipping resistance and wear resistance under cutting work conditions under which high-temperature heat is generated and high impact and mechanical loads are exerted on a cutting edge, such as high-speed milling of a high hardness material like hardened steel, while focusing on a layer forming material that forms the hard coating layer of the coated tool of the related art and the crystal structure thereof. As a result, the following knowledge was obtained.

In the coated tool of the related art described in Japanese Patent No. 3781374, the Al component of the (Al,Cr,Si)N layer forming the hard coating layer has an effect of improving high-temperature hardness, the Cr component has an effect of improving high-temperature toughness and high-temperature strength and improving high-temperature oxidation resistance in a state in which Al and Cr coexist with each other, and the Si component has an effect of improving heat-resistant plastic deformability. However, under cutting conditions under which high-temperature heat is generated and high impact and mechanical loads are exerted on a cutting edge, the occurrence of chipping, fracturing, and the like cannot be avoided, and for example, even when there is an attempt to improve the high-temperature toughness and high-temperature strength by increasing the Cr content ratio, the wear resistance decreases due to a relative reduction of the Al content ratio. Therefore, there is a limitation on the improvement in the chipping resistance and wear resistance of the hard coating layer formed of the (Al,Cr,Si)N layer.

On the other hand, in the coated tools of the related art described in Japanese Unexamined Patent Application, First Publication No. 2004-34186, Japanese Unexamined Patent Application, First Publication No. 2008-31517 and Japanese Unexamined Patent Application, First Publication No. 2008-73800, it is suggested that crystal grain refinement is achieved by including Cu as the component of the hard coating layer, thereby improving the wear resistance. However, while the wear resistance is improved, the toughness is decreased, so that the occurrence of chipping cannot be suppressed, and the tool life is still short.

Here, the inventors found that an improvement in wear resistance by crystal grain refinement is achieved by including Cu as a component of a hard coating layer formed of an (Al,Cr,Si)N layer, and the toughness of the hard coating layer is improved by causing the crystal structure of the hard coating layer to be a hexagonal structure, whereby both excellent chipping resistance and excellent wear resistance of a coated tool can be achieved even under cutting work conditions under which high-temperature heat is generated and high impact and mechanical loads are exerted on a cutting edge, such as high-speed milling of a high hardness material like hardened steel.

SUMMARY OF THE INVENTION

The present invention is made based on the above-described knowledge and has the following aspects.

(1) A surface-coated cutting tool including: a tool body made of any one selected from the group consisting of tungsten carbide-based cemented carbide, TiCN-based cermet, a cubic boron nitride sintered material, and high-speed tool steel; and a hard coating layer provided on a surface of the tool body, wherein the hard coating layer includes at least a complex nitride layer of Al, Cr, Si, and Cu with an average layer thickness of 0.5 to 8.0 μm, in a case where the complex nitride layer is expressed by a composition formula: $(Al_{1-a-b-c}Cr_aSi_bCu_c)N$, the complex nitride layer satisfies $0.15 \leq a \leq 0.40$, $0.05 \leq b \leq 0.20$, and $0.005 \leq c \leq 0.05$ (here, each of a, b, and c is in atomic ratio), and a crystal structure of the complex nitride layer is a hexagonal structure, and a half width of a diffraction peak of a (110) plane present in a range of $2\theta = 55°$ to $65°$ obtained by performing X-ray diffraction on the complex nitride layer is $1.0°$ to $3.5°$.

(2) The surface-coated cutting tool according to (1), the complex nitride layer contains crystals of a cubic structure with crystals of the hexagonal structure in the layer.

(3) The surface-coated cutting tool according to (1) or (2), wherein, when it is defined that a diffraction peak intensity of a cubic (200) plane of the complex nitride layer is c(200) and a diffraction peak intensity of a hexagonal (110) plane of the complex nitride layer is h(110), a peak intensity ratio satisfies $c(200)/h(110) < 1$.

Next, a coated cutting tool according to an aspect of the present invention (hereinafter, referred to as "coated cutting tool of the present invention") will be described in detail.

Composition of Complex Nitride Layer of Al, Cr, Si, and Cu:

In a complex nitride layer of Al, Cr, Si, and Cu (hereinafter, sometimes referred to as "(Al,Cr,Si,Cu)N layer"), the Al component has an effect of improving high-temperature hardness, the Cr component has an effect of improving high-temperature toughness and high-temperature strength and improving high-temperature oxidation resistance in a state in which Al and Cr coexist with each other, the Si component has an effect of improving heat-resistant plastic deformability, and the Cu component has an effect of improving wear resistance by refining crystal grains.

In addition, when the a value (atomic ratio) representing the Cr content ratio in the (Al,Cr,Si,Cu)N layer is less than 0.15 as a ratio to the total amount of Al, Si, and Cu, the minimum required high-temperature toughness and high-temperature strength cannot be secured. Therefore, the occurrence of chipping and fracturing cannot be suppressed. When the a value exceeds 0.40, due to a relative reduction of the Al content ratio, wear progression is promoted. Therefore, the a value is set to 0.15 to 0.40. In addition, when the b value (atomic ratio) representing the Si content ratio is less than 0.05 as a ratio to the total amount of Al, Cr, and Cu, the improvement in wear resistance due to the improvement in heat-resistant plastic deformability cannot be expected. When the b value exceeds 0.20, there is a trend toward a reduction of the effect of improving the wear resistance. Therefore, the b value is set to 0.05 to 0.20. Furthermore, when the c value (atomic ratio) representing the Cu content ratio is less than 0.005 as a ratio to the total amount of Al, Cr, and Si, a further improvement in wear resistance cannot be expected. When the c value exceeds 0.05, particles are likely to be generated when the (Al,Cr,Si,Cu)N layer is formed by an arc ion plating (hereinafter, referred to as "AIP") apparatus, and the chipping resistance decreases during cutting work during which high impact and mechanical loads are exerted. Therefore, the c value is set to 0.005 to 0.05.

Desirable ranges of a, b, and c are $0.15 \leq a \leq 0.25$, $0.05 \leq b \leq 0.15$, $0.01 \leq c \leq 0.03$.

Average Layer Thickness of (Al,Cr,Si,Cu)N Layer:

When the average layer thickness of the (Al,Cr,Si,Cu)N layer is less than 0.5 μm, excellent wear resistance cannot be exhibited for a long-term usage. When the average layer thickness thereof exceeds 8.0 μm, chipping and fracturing are likely to occur. Therefore, the average layer thickness of the (Al,Cr,Si,Cu)N layer is set to 0.5 to 8.0 μm.

Crystal Structure of (Al,Cr,Si,Cu)N Layer:

In the present invention, in order to achieve both the chipping resistance and excellent wear resistance of the hard coating layer under cutting work conditions under which high-temperature heat is generated and high impact and mechanical loads are exerted on a cutting edge, such as high-speed milling of a high hardness material like hardened steel, the composition and layer thickness of the (Al,Cr,Si,Cu)N layer are set as described above. However, in addition to this, the chipping resistance can be further improved by causing the crystal structure of the layer to be hexagonal.

Film formation of a hard coating using an AIP equipment is hitherto known. However, when film formation is performed using an Al—Cr—Si—Cu alloy as a target under typical conditions, an (Al,Cr,Si,Cu)N layer that is formed has a cubic structure or primarily has a cubic structure.

Here, in the present invention, when film formation is performed by an AIP equipment 6 using an Al—Cr—Si—Cu alloy shown in FIGS. 1A and 1B as a target, by performing the film formation in a magnetic field, controlling the maximum magnetic flux density applied to the surface of the target, and controlling a bias voltage, an (Al,Cr,Si,Cu)N layer composed of crystals having a hexagonal structure other than a cubic structure can be formed.

For example, by adjusting vapor deposition conditions to cause the maximum magnetic flux density applied to the surface of the target to be in a range of 7 to 15 mT (millitesla) and cause the bias voltage applied to the tool body to be in a range of −75 to −150 V, an (Al,Cr,Si,Cu)N layer composed of crystals having a hexagonal structure other than a cubic structure can be formed.

Since the crystal structure of the (Al,Cr,Si,Cu)N layer is the hexagonal structure, the toughness can be improved without the decrease in the wear resistance. As a result, the chipping resistance is improved.

The (Al,Cr,Si,Cu)N layer provided in the coated cutting tool of the present invention can be composed of crystals all having a hexagonal structure. However, even when crystals having a cubic structure are slightly contained in the layer, there is no adverse effect on chipping resistance and wear resistance.

However, when the diffraction peak intensity of a cubic (200) plane obtained by X-ray diffraction exceeds the diffraction peak intensity of a hexagonal (110) plane, while the wear resistance is improved, the chipping resistance decreases. Therefore, when it is defined that the diffraction peak intensity of the cubic (200) plane is c(200) and the diffraction peak intensity of the hexagonal (110) plane is h(110), it is desirable that the peak intensity ratio satisfies c(200)/h(110)<1.

In a case where the peak intensity ratio is less than 0.05, for convenience, the peak intensity ratio is regarded as "0".

Hereinafter, both of the case where the entire crystal structure of the (Al,Cr,Si,Cu)N layer is a hexagonal structure and the case where crystals having a cubic structure are slightly contained in the (Al,Cr,Si,Cu)N layer are expressed as a case where the crystal structure of the (Al,Cr,Si,Cu)N layer primarily has a hexagonal structure.

When X-ray diffraction is performed on the (Al,Cr,Si,Cu)N layer provided in the coated cutting tool of the present invention, as shown in FIG. 2, a diffraction peak peculiar to the hexagonal structure from a (110) plane is observed when 2θ is in a range of 55° to 65°.

In a case where the diffraction peak is sharp, that is, in a case where the half width thereof is less than 1.0°, the wear resistance of the (Al,Cr,Si,Cu)N layer decreases. In a case where the peak is broad and the half width is more than 3.5°, there is a trend toward a reduction of the chipping resistance of the (Al,Cr,Si,Cu)N layer. Therefore, the half width of the diffraction peak from the (110) plane present when 2θ measured by X-ray diffraction is in a range of 55° to 65° is set to 1.0° to 3.5°.

Advantageous Effects of Invention

In the coated cutting tool of the present invention, the hard coating layer includes at least the layer formed of the (Al,Cr,Si,Cu)N layer having the predetermined composition, the crystal structure of the (Al,Cr,Si,Cu) layer is primarily the hexagonal structure, and in a case where X-ray diffraction is performed on the (Al,Cr,Si,Cu)N layer, the half width of the diffraction peak of the (110) plane present in a range of 2θ=55° to 65° is 1.0° to 3.5°, whereby the (Al,Cr,Si,Cu)N layer has excellent chipping resistance and wear resistance. Therefore, even during high-speed milling of a high hardness material like hardened steel during which high-temperature heat is generated and high impact and mechanical loads are exerted on a cutting edge, the coated cutting tool of the present invention exhibits excellent chipping resistance and wear resistance for long-term usage.

DETAILED DESCRIPTION OF THE INVENTION

Next, the coated cutting tool of the present invention will be described in more detail with reference to examples.

In the examples, a case of using WC-based cemented carbide as a tool body is described. However, the examples are similarly applied to a case of using TiCN-based cermet, a cubic boron nitride-based sintered material, or high-speed tool steel as a tool body.

Example

As raw material powders, a medium coarse WC powder having an average particle diameter of 5.5 μm, a fine WC powder of 0.8 μm, a TaC powder of 1.3 μm, an NbC powder of 1.2 μm, a ZrC powder of 1.2 μm, a $Cr_3C_2$ powder of 2.3 μm, a VC powder of 1.5 μm, a (Ti,W)C [TiC/WC=50/50 in mass ratio] of 1.0 μm, and a Co powder of 1.8 μm were prepared, and the raw material powders were mixed in mixing compositions shown in Table 1. Wax was further added thereto, and the mixture was blended in acetone by a ball mill for 24 hours and was decompressed and dried. Thereafter, the resultant was extruded and press-formed into various compacts having predetermined shapes at a pressure of 100 MPa, and the compacts were heated to a predetermined temperature in a range of 1370° C. to 1470° C. at a heating rate of 7° C./min in a vacuum atmosphere at 6 Pa, were held at this temperature for one hour, and were sintered under furnace cooling conditions, thereby forming round bar sintered materials for forming cutting tool bodies having a diameter of 10 mm. Furthermore, from the round bar sintered materials, by performing grinding, each of cutting tool bodies (end mills) 1 to 3 made of WC-based cemented carbide having a two-edge ball shape with a helix angle of 30 degrees in dimensions of 6 mm×12 mm as the diameter× the length of the cutting edge portion was produced.

Figure 1A:
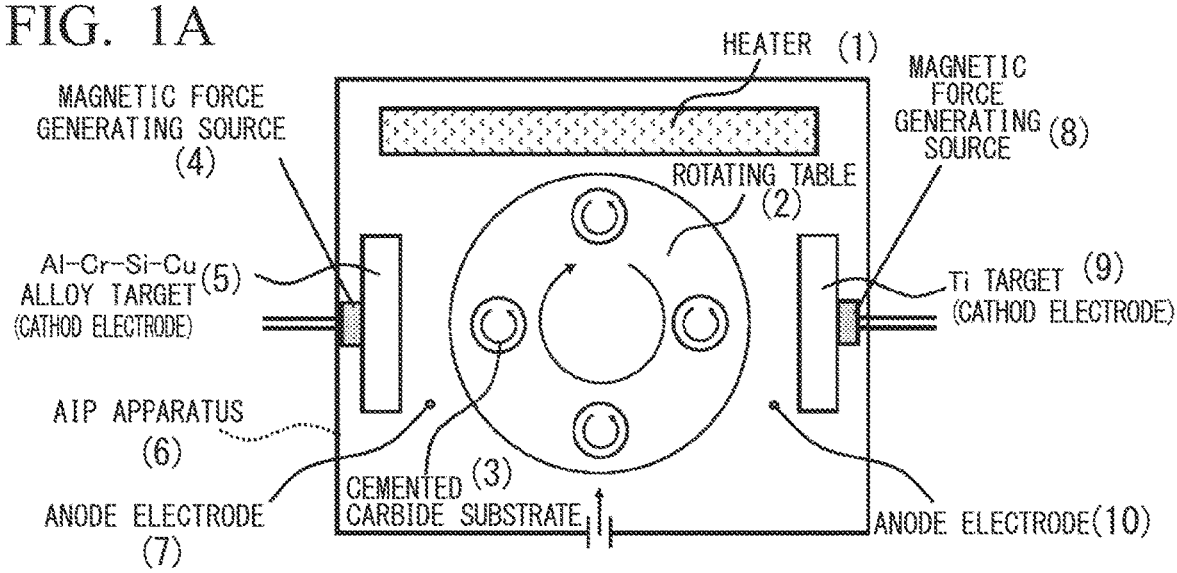
FIG. 1A is a schematic plan view of an arc ion plating apparatus used to form an (Al,Cr,Si,Cu)N layer provided in a coated cutting tool of the present invention.
Figure 1B:
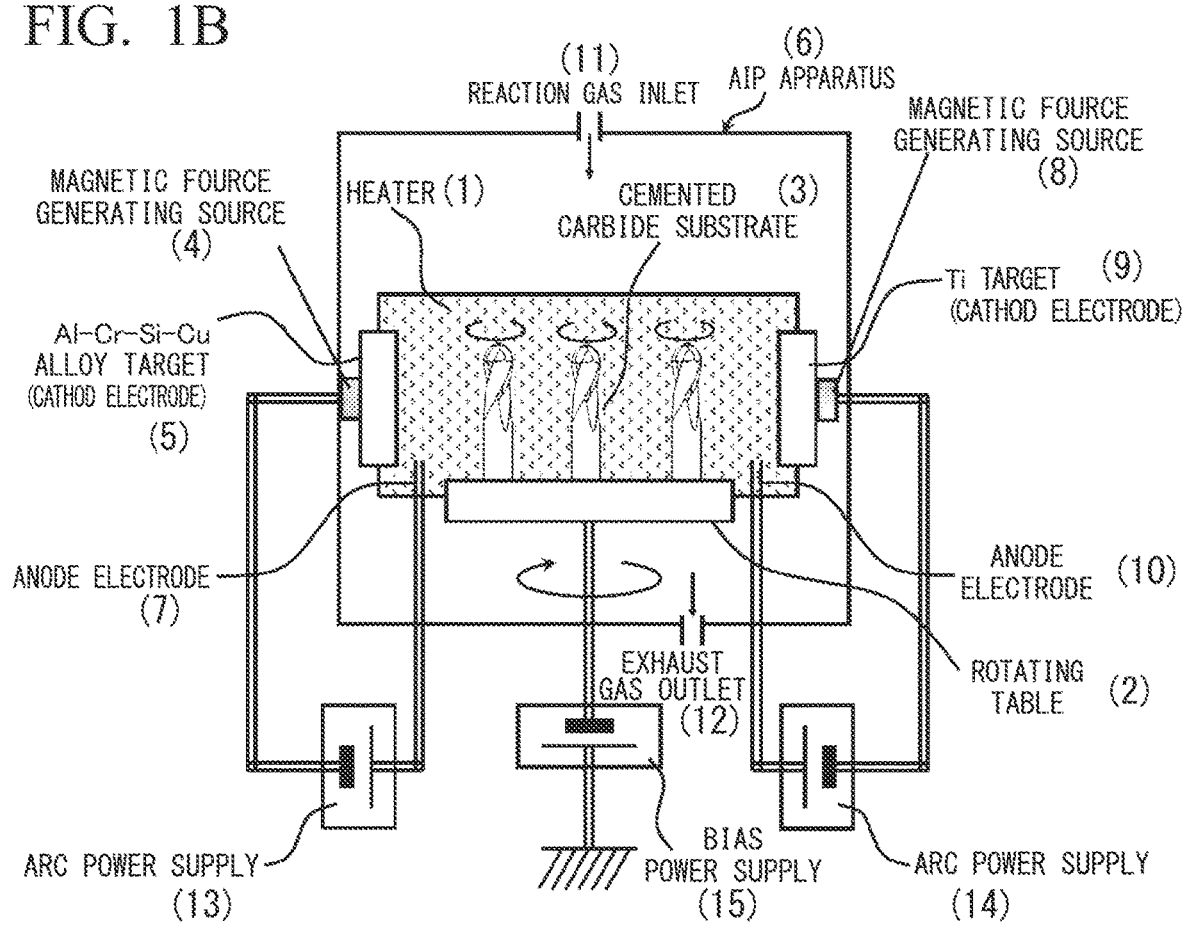
FIG. 1B is a schematic front view of the arc ion plating apparatus used to form the (Al,Cr,Si,Cu)N layer provided in the coated cutting tool of the present invention.
Figure 2:
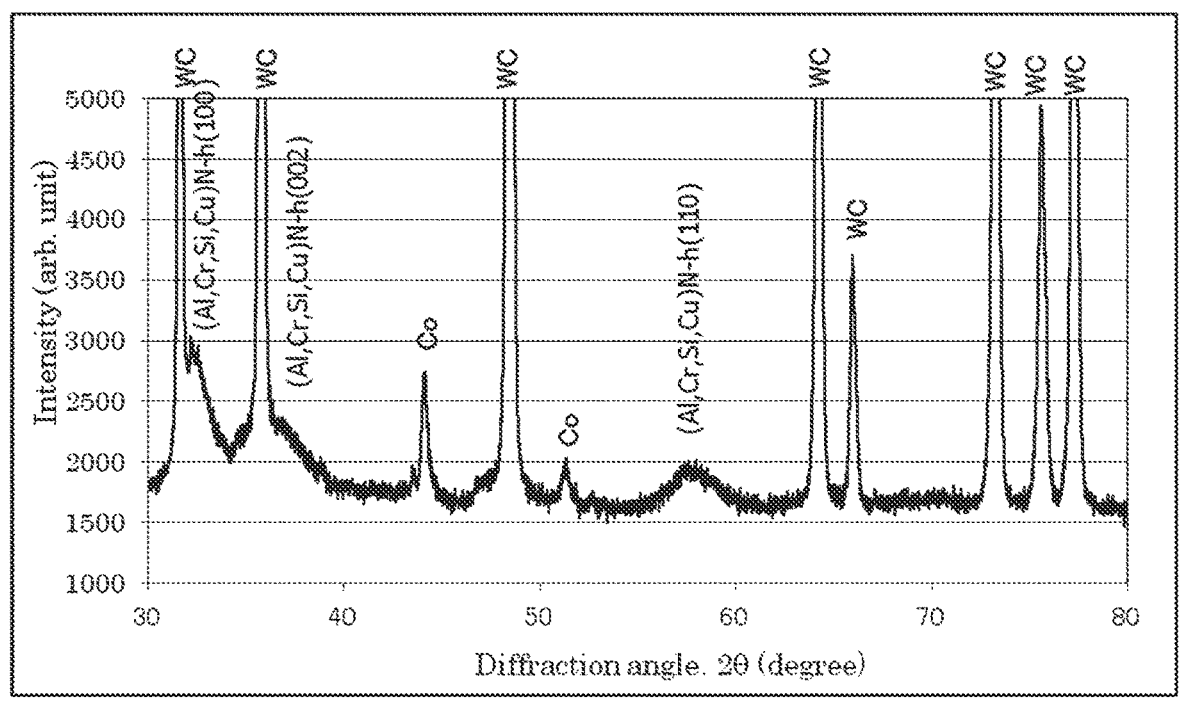
FIG. 2 is an example of an X-ray diffraction chart measured for the (Al,Cr,Si,Cu)N layer provided in the coated cutting tool of the present invention.

(a) The cutting tool bodies 1 to 3 mentioned above were subjected to ultrasonic cleaning in acetone and were dried, and in this state, were mounted at positions distant from the center axis on a rotating table 2 of the AIP equipment 6 shown in FIGS. 1A and 1B by predetermined distances in the radial direction along the outer circumferential portion, a Ti cathode electrode 9 for bombardment cleaning was disposed on one side of the AIP equipment 6, and a target (cathode electrode) 5 made of an Al—Cr—Si—Cu alloy having a predetermined composition was disposed on the other side.

(b) First, while the inside of the apparatus was evacuated and held in a vacuum, the tool body 3 was heated to 400° C. by a heater 1. Thereafter, a DC bias voltage of −1000 V was applied to the tool body 3 that was rotated while revolving on the rotating table 2 to cause a current of 100 A to flow between the Ti cathode electrode 5 and an anode electrode 10 and generate arc discharge such that the surface of the tool body was subjected to bombardment cleaning.

(c) Next, a magnetic field controlled to various maximum magnetic flux densities shown in Table 2 was applied to the surface of the Al—Cr—Si—Cu alloy target 5.

(d) Next, nitrogen gas as a reaction gas was introduced into the apparatus to reach a nitrogen pressure shown in Table 2, and while maintaining the temperature of the tool body 3 that was rotated while revolving on the rotating table 2 in a temperature range shown in Table 2, a DC bias voltage shown in Table 2 was applied to cause a current of 100 A to flow between the Al—Cr—Si—Cu alloy target 5 and an anode electrode 7 and generate arc discharge, thereby depositing a hard coating layer formed of an (Al,Cr,Si,Cu)N layer having a composition and a target average layer thickness shown in Table 4 on the surface of the tool body 3. Accordingly, each of surface-coated end mills 1 to 10 (hereinafter, referred to as Present Inventions 1 to 10) as the coated cutting tool of the present invention shown in Table 4 was manufactured.

Comparative Example

For the purpose of comparison, each of surface-coated end mills 1 to 10 (hereinafter, referred to as Comparative Examples 1 to 10) was produced as a comparative example coated cutting tool shown in Table 5 by performing the process of (c) in the example described above under the conditions shown in Table 3 (that is, the maximum magnetic flux density of the surface of the Al—Cr—Si—Cu alloy target 5 was changed), performing the process of (d) under the conditions shown in Table 3 (that is, the nitrogen partial pressure and the DC bias voltage were changed), and employing the same conditions as those of the example as the other conditions.

The compositions of the hard coating layers of Present Inventions 1 to 10 and Comparative Examples 1 to 10 produced as described above were measured by energy-dispersive X-ray spectroscopy (EDS) using a scanning electron microscope (SEM).

The layer thicknesses thereof were measured in a cross-section using the scanning electron microscope, and the average layer thickness was calculated from the average value of the measured values at five points.

Furthermore, X-ray diffraction was performed on the hard coating layers in Present Inventions 1 to 10 and Comparative Examples 1 to 10 produced as described above, background removal was performed, a peak of a (110) plane shown in a range of 2θ=55° to 65° representing a hexagonal structure was then fitted with a pseudo-Voigt function, and the half width of the peak was measured.

In addition, the X-ray diffraction measurement was performed by a 2θ-θ method using CuKα radiation with an X-ray diffractometer PANalytical Empyrean manufactured by Spectris., and the measurement was performed under measurement conditions of a measurement range (2θ) of 30 to 80 degrees, an X-ray output of 45 kV, 40 mA, a divergence slit of 0.5 degrees, a scan step of 0.013 degrees, and a measurement time per one step of 0.48 sec/step.

Tables 4 and 5 show measured and calculated values.

TABLE 1

| Type | | Co | (Ti, W)C | TaC | NbC | ZrC | $Cr_3C_2$ | VC | WC | Diameter × length of cutting edge portion (mm) |
|---|---|---|---|---|---|---|---|---|---|---|
| Tool body | 1 | 5 | 5 | — | — | — | — | — | Medium coarse powder: balance | 6 × 12 |
| | 2 | 6 | — | 1 | 0.5 | — | — | — | Fine powder: balance | 6 × 12 |
| | 3 | 6 | — | 1 | — | 1 | 0.5 | 0.5 | Fine powder: balance | 6 × 12 |

Blending composition(mass %)

TABLE 2

| Type | | Tool body symbol | Tool body temperature (° C.) | Nitrogen partial pressure (Pa) | Bias voltage (V) | Target surface maximum magnetic flux density (mT) |
|---|---|---|---|---|---|---|
| Present Invention | 1 | 1 | 500 | 9.3 | −75 | 13 |
| | 2 | 2 | 400 | 6.7 | −100 | 10 |
| | 3 | 3 | 450 | 4 | −100 | 10 |
| | 4 | 1 | 350 | 9.3 | −75 | 7 |
| | 5 | 2 | 500 | 6.7 | −100 | 13 |
| | 6 | 3 | 400 | 4 | −125 | 10 |
| | 7 | 1 | 450 | 6.7 | −100 | 7 |
| | 8 | 2 | 350 | 4 | −125 | 13 |

Film depositing conditions

TABLE 2-continued

| | | Film depositing conditions | | | |
|---|---|---|---|---|---|
| Type | Tool body symbol | Tool body temperature (° C.) | Nitrogen partial pressure (Pa) | Bias voltage (V) | Target surface maximum magnetic flux density (mT) |
| 9 | 3 | 400 | 6.7 | −75 | 10 |
| 10 | 1 | 450 | 9.3 | −125 | 7 |

TABLE 3

| | | | Film depositing conditions | | | |
|---|---|---|---|---|---|---|
| Type | | Tool body symbol | Tool body temperature (° C.) | Nitrogen partial pressure (Pa) | Bias voltage (V) | Target surface maximum magnetic flux density (mT) |
| Comparative Example | 1 | 1 | 400 | 4 | −25 | 5 |
| | 2 | 2 | 500 | 1.3 | −150 | 10 |
| | 3 | 3 | 350 | 9.3 | −25 | 1 |
| | 4 | 1 | 450 | 6.7 | −30 | 3.5 |
| | 5 | 2 | 400 | 4 | −50 | 5 |
| | 6 | 3 | 500 | 9.3 | −50 | 1 |
| | 7 | 1 | 350 | 6.7 | −30 | 3.5 |
| | 8 | 2 | 450 | 1.3 | −25 | 10 |
| | 9 | 3 | 400 | 6.7 | −50 | 5 |
| | 10 | 1 | 500 | 4 | −30 | 1 |

TABLE 4

| | | (Al, Cr, Si, Cu)N layer | | | | | |
|---|---|---|---|---|---|---|---|
| | | Composition (atomic ratio) | | | Average layer | Half | X-ray diffraction |
| Type | | Tool body symbol | a value | b value | c value | thickness (µm) | width of h(110) | peak intensity ratio c(200)/h(110) |
| Present Invention | 1 | 1 | 0.40 | 0.20 | 0.005 | 0.5 | 3.5 | 0 |
| | 2 | 2 | 0.15 | 0.14 | 0.01 | 5.0 | 3.2 | 0 |
| | 3 | 3 | 0.17 | 0.10 | 0.02 | 3.5 | 2.5 | 0 |
| | 4 | 1 | 0.28 | 0.05 | 0.05 | 2.5 | 1.0 | 0 |
| | 5 | 2 | 0.30 | 0.08 | 0.04 | 8.0 | 2.3 | 0 |
| | 6 | 3 | 0.36 | 0.18 | 0.005 | 2.0 | 3.0 | 0 |
| | 7 | 1 | 0.15 | 0.14 | 0.01 | 1.5 | 2.8 | 0 |
| | 8 | 2 | 0.18 | 0.10 | 0.02 | 4.0 | 2.0 | 0.1 |
| | 9 | 3 | 0.28 | 0.05 | 0.05 | 5.5 | 1.7 | 0.4 |
| | 10 | 1 | 0.32 | 0.08 | 0.03 | 3.0 | 2.2 | 0.8 |

(Note 1)
"Half width of h(110)" is the half width of the diffraction peak of a (110) plane present in a range of 2θ = 55° to 65° obtained by X-ray diffraction.

TABLE 5

| | | (Al, Cr, Si, Cu)N layer | | | | | |
|---|---|---|---|---|---|---|---|
| | | Composition (atomic ratio) | | | Average layer | Half | X-ray diffraction |
| Type | | Tool body symbol | a value | b value | c value | thickness (µm) | width of h(110) | peak intensity ratio c(200)/h(110) |
| Comparative Example | 1 | 1 | 0.40 | 0.20 | 0.10* | 2.5 | 3.4 | 0 |
| | 2 | 2 | 0.15 | 0.14 | 0.01 | 5.2 | 5.5* | 0 |
| | 3 | 3 | 0.50* | 0.10 | 0.02 | 3.0 | 3.5 | 0 |
| | 4 | 1 | 0.28 | 0.05 | 0.05 | 0.3* | 1.8 | 0 |

TABLE 5-continued

| | | (Al, Cr, Si, Cu)N layer | | | | | |
|---|---|---|---|---|---|---|---|
| | | Composition (atomic ratio) | | | Average layer | Half | X-ray diffraction |
| Type | Tool body symbol | a value | b value | c value | thickness (μm) | width of h(110) | peak intensity ratio c(200)/h(110) |
| | 5 | 2 | 0.32 | 0.03* | 0.03 | 1.5 | 2.0 | 0 |
| | 6 | 3 | 0.17 | 0.10 | 0.02 | 4.8 | 0.8* | 0 |
| | 7 | 1 | 0.10* | 0.05 | 0.05 | 2.6 | 3.0 | 0 |
| | 8 | 2 | 0.40 | 0.25* | 0.005 | 1.0 | 3.3 | 0.2 |
| | 9 | 3 | 0.28 | 0.05 | 0.003* | 3.5 | 2.3 | 0.7 |
| | 10 | 1 | 0.32 | 0.08 | 0.03 | 9.0* | 2.0 | 0.6 |

(Note 1)
"Half width of h(110)" is the half width of the diffraction peak of a (110) plane present in a range of 2θ = 55° to 65° obtained by X-ray diffraction.
(Note 2)
Mark * in boxes indicates outside of the range of the present invention.

Next, the end mills of Present Inventions 1 to 10 and Comparative Examples 1 to 10 were subjected to a side face cutting test of alloy tool steel under the following conditions (referred to cutting condition A).

Work material—a plate material of JIS SKD11 (60HRC) having planar dimensions of 100 mm×250 mm and a thickness of 50 mm
Cutting speed: 100 m/min
Rotational speed: 5400 min.$^{-1}$
Depth of cut: ae 0.2 mm, ap 2 mm
Feed speed (per one edge): 0.05 mm/tooth
Cutting length: 40 m Furthermore, a side face cutting test of high-speed tool steel was performed under the following conditions (referred to as cutting condition B).

Work material—a plate material of JIS SKH51 (64HRC) having planar dimensions of 100 mm×250 mm and a thickness of 50 mm
Cutting speed: 100 m/min
Rotational speed: 5400 min.$^{-1}$
Depth of cut: ae 0.2 mm, ap 2 mm
Feed speed (per one edge): 0.05 mm/tooth
Cutting length: 10 m The wear width of the flank face of a cutting edge was measured in any of the side face cutting tests.

The measurement results are shown in Table 6.

hard coating layer, the crystal structure of the (Al,Cr,Si,Cu)N layer is primarily a hexagonal structure, and furthermore, in a case where X-ray diffraction is performed, the half width of the diffraction peak of the (110) plane present in a range of 2θ=55° to 65° is 1.0° to 3.5°, whereby excellent chipping resistance and wear resistance are exhibited during cutting work of a high hardness material like hardened steel and excellent cutting performance is exhibited for long-term usage.

Contrary to this, in the comparative example coated cutting tool in which the composition and the crystal structure of the (Al,Cr,Si,Cu)N layer forming the hard coating layer or the half width of the diffraction peak of the (110) plane deviates the range specified in the present invention, it is obvious that the service life is reached within a relatively short period of time due to the occurrence of chipping or wear progression.

In addition, Table 6 in the example described above is applied to the coated cutting tool of the present invention in which the WC-based cemented carbide is used as the tool body. However, the tool body is not limited to the WC-based cemented carbide, and a TiCN-based cermet, a cubic boron nitride-based sintered material, or high-speed tool steel can be used as the tool body, and in a coated cutting tool of the present invention using this as the tool body, excellent

TABLE 6

| | | Wear width of flank face (mm) | | | | Wear width of flank face (mm) | |
|---|---|---|---|---|---|---|---|
| Type | | Cutting condition (A) | Cutting condition (B) | Type | | Cutting condition (A) | Cutting condition (B) |
| Present Invention | 1 | 0.08 | 0.06 | Comparative Example | 1 | 0.15 | 0.17 |
| | 2 | 0.05 | 0.03 | | 2 | 36 m* | 7 m* |
| | 3 | 0.03 | 0.05 | | 3 | 0.18 | 0.19 |
| | 4 | 0.10 | 0.08 | | 4 | 20 m* | 6 m* |
| | 5 | 0.03 | 0.04 | | 5 | 0.16 | 0.15 |
| | 6 | 0.07 | 0.06 | | 6 | 25 m* | 0.20 |
| | 7 | 0.06 | 0.05 | | 7 | 0.18 | 5 m* |
| | 8 | 0.10 | 0.04 | | 8 | 30 m* | 0.18 |
| | 9 | 0.04 | 0.03 | | 9 | 0.20 | 6 m* |
| | 10 | 0.08 | 0.09 | | 10 | 0.16 | 0.13 |

(in the table, mark "*" in boxes of the comparative examples is a cutting length (m) until the service life (wear width of flank face 0.2 mm) is reached due to chipping or wear)

From the results shown in Table 6, in the coated cutting tool of the present invention, at least the (Al,Cr,Si,Cu)N layer having a predetermined composition is included as the chipping resistance and excellent wear resistance are exhibited for a long-term usage. As in the above-described examples.

INDUSTRIAL APPLICABILITY

As described above, the coated cutting tool of the present invention exhibits excellent cutting performance for a long-term usage in a case of being provided for high-speed milling of a high hardness material like hardened steel. Therefore, the coated cutting tool of the present invention can satisfactorily cope with the factory automation of cutting apparatuses, power saving and energy saving during cutting work, and a further reduction of costs.

REFERENCE SIGNS LIST

1: Heater
2: Rotating table
3: Cemented carbide substrate
4, 8: Magnetic force generating source
5: Al—Cr—Si—Cu alloy target (cathode electrode)
6: AIP equipment
7, 10: Anode electrode
9: Ti target (cathode electrode)
11: Reactive gas inlet
12: Exhaust gas outlet
13, 14: Arc electrode
15: Bias electrode

What is claimed is:

1. A surface-coated cutting tool comprising:
a tool body made of any one selected from the group consisting of tungsten carbide-based cemented carbide, TiCN-based cermet, a cubic boron nitride sintered material, and high-speed tool steel; and
a hard coating layer provided on a surface of the tool body, wherein
the hard coating layer includes at least a complex nitride layer of Al, Cr, Si, and Cu with an average layer thickness of 0.5 to 8.0 μm,
in a case where the complex nitride layer is expressed by a composition formula: $(Al_{1-a-b-c}Cr_aSi_bCu_c)N$,
the complex nitride layer satisfies $0.15 \leq a \leq 0.40$, $0.05 \leq b \leq 0.20$, and $0.005 \leq c \leq 0.05$ (here, each of a, b, and c is in atomic ratio), and
a crystal structure of the complex nitride layer is a hexagonal structure, and a half width of a diffraction peak of a (110) plane present in a range of $2\theta=55°$ to $65°$ obtained by performing X-ray diffraction on the complex nitride layer is $1.0°$ to $3.5°$.

2. The surface-coated cutting tool according to claim 1, wherein the complex nitride layer contains crystals of a cubic structure with crystals of the hexagonal structure in the layer.

3. The surface-coated cutting tool according to claim 1, wherein, when it is defined that a diffraction peak intensity of a cubic (200) plane of the complex nitride layer is c(200) and a diffraction peak intensity of a hexagonal (110) plane of the complex nitride layer is h(110), a peak intensity ratio satisfies c(200)/h(110)<1.

4. The surface-coated cutting tool according to claim 2, wherein, when it is defined that a diffraction peak intensity of a cubic (200) plane of the complex nitride layer is c(200) and a diffraction peak intensity of a hexagonal (110) plane of the complex nitride layer is h(110), a peak intensity ratio satisfies c(200)/h(110)<1.

* * * * *